(12) United States Patent
Kwak et al.

(10) Patent No.: US 11,979,997 B2
(45) Date of Patent: May 7, 2024

(54) FOLDABLE DISPLAY DEVICE

(71) Applicant: LG DISPLAY CO., LTD., Seoul (KR)

(72) Inventors: MooJin Kwak, Paju-si (KR);
Sangwook Woo, Paju-si (KR); Sinchul Kang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 154 days.

(21) Appl. No.: 17/404,133

(22) Filed: Aug. 17, 2021

(65) Prior Publication Data

US 2022/0201879 A1 Jun. 23, 2022

(30) Foreign Application Priority Data

Dec. 17, 2020 (KR) .................. 10-2020-0177664

(51) Int. Cl.
*H05K 5/02* (2006.01)
*G06F 1/16* (2006.01)

(52) U.S. Cl.
CPC ......... *H05K 5/0217* (2013.01); *G06F 1/1637* (2013.01); *G06F 1/1641* (2013.01)

(58) Field of Classification Search
CPC ... H05K 5/0217; G06F 1/1637; G06F 1/1641; G06F 1/1652; G06F 1/1618
See application file for complete search history.

(56) References Cited

U.S. PATENT DOCUMENTS

| | | | | |
|---|---|---|---|---|
| 10,504,987 B2* | 12/2019 | Han | | H10K 59/131 |
| 2010/0201604 A1* | 8/2010 | Kee | | G06F 1/1616 |
| | | | | 345/1.3 |
| 2015/0378391 A1* | 12/2015 | Huitema | | H05K 1/183 |
| | | | | 361/679.03 |
| 2016/0260904 A1* | 9/2016 | Park | | H10K 50/85 |
| 2016/0291783 A1* | 10/2016 | Cotton | | G02F 1/133305 |
| 2016/0303843 A1* | 10/2016 | Jang | | B32B 37/0084 |
| 2016/0306393 A1* | 10/2016 | Huitema | | G06F 1/1643 |
| 2017/0061836 A1* | 3/2017 | Kim | | G06F 1/1626 |
| 2017/0196078 A1* | 7/2017 | Choi | | G06F 1/1641 |
| 2017/0309843 A1* | 10/2017 | Kim | | B32B 3/266 |
| 2018/0190936 A1* | 7/2018 | Lee | | B32B 25/20 |
| 2019/0326530 A1* | 10/2019 | Chen | | H10K 59/00 |
| 2019/0334114 A1* | 10/2019 | Park | | H05K 5/0226 |
| 2020/0223206 A1* | 7/2020 | Najiminaini | | B81C 1/00634 |
| 2020/0233464 A1* | 7/2020 | Lee | | H04M 1/022 |
| 2020/0234616 A1* | 7/2020 | Ha | | G06F 1/1652 |
| 2020/0329569 A1* | 10/2020 | Kim | | H05K 5/0226 |
| 2020/0344897 A1* | 10/2020 | Kim | | G06F 1/1641 |

(Continued)

FOREIGN PATENT DOCUMENTS

KR    10-1998982    7/2018
KR    10-2020-0037712 A    4/2020

*Primary Examiner* — Sagar Shrestha

(74) *Attorney, Agent, or Firm* — POLSINELLI PC

(57) ABSTRACT

A foldable display device includes a display panel including a folding area and non-folding areas on both sides of the folding area and a back plate disposed under the display panel; and a support substrate disposed under the back plate and made of a metal or alloy including a plurality of pores, the support substrate includes a plurality of groove patterns recessed from a bottom surface toward a top surface of the support substrate and corresponding to the folding area, thereby minimizing recognition of the patterns in the folding area of the display panel and improve the folding properties.

18 Claims, 9 Drawing Sheets

(56) References Cited

U.S. PATENT DOCUMENTS

| | | | | |
|---|---|---|---|---|
| 2020/0366770 | A1* | 11/2020 | Kim | H04M 1/0241 |
| 2020/0389986 | A1* | 12/2020 | Tsuchihashi | G06F 1/1616 |
| 2021/0068270 | A1* | 3/2021 | Zhou | G06F 1/1681 |
| 2021/0165454 | A1* | 6/2021 | Dong | G06F 1/1652 |
| 2021/0173450 | A1* | 6/2021 | Kim | G06F 1/1652 |
| 2021/0191468 | A1* | 6/2021 | Nakamura | G06F 3/04164 |
| 2021/0217975 | A1* | 7/2021 | Gu | G09F 9/30 |
| 2021/0259110 | A1* | 8/2021 | Ha | G06F 1/1652 |
| 2021/0319724 | A1* | 10/2021 | Jang | G06F 1/1641 |
| 2021/0325929 | A1* | 10/2021 | Cai | B32B 3/263 |
| 2021/0360800 | A1* | 11/2021 | Horiuchi | G06F 1/1652 |
| 2022/0132679 | A1* | 4/2022 | Han | G06F 1/1681 |
| 2022/0187871 | A1* | 6/2022 | Yamazaki | H10K 59/00 |
| 2022/0199923 | A1* | 6/2022 | Yamane | B32B 15/09 |
| 2022/0294886 | A1* | 9/2022 | Seo | G06F 1/1641 |
| 2022/0309964 | A1* | 9/2022 | Wang | H05K 7/1438 |
| 2022/0374058 | A1* | 11/2022 | Kim | G06F 1/1686 |
| 2023/0018777 | A1* | 1/2023 | Park | G09F 9/30 |
| 2023/0050666 | A1* | 2/2023 | Li | G06F 1/1656 |
| 2023/0071578 | A1* | 3/2023 | Sim | G06F 1/1656 |

* cited by examiner

FOLDABLE DISPLAY DEVICE

CROSS-REFERENCE TO RELATED APPLICATION

This application claims the priority of Korean Patent Application No. 10-2020-0177664 filed on Dec. 17, 2020, which is hereby incorporated by reference in its entirety.

BACKGROUND

Field of the Disclosure

The present disclosure relates to a foldable display device, and more particularly, to a foldable display device which has a decrease in thickness with improved folding properties.

Description of the Background

Recently, with the advancement of the information age, display devices for processing and displaying a large amount of information have been developed. Display devices used in monitors of computers, TVs, and cell phones may include organic light emitting display (OLED) devices which is a self-emitting device, liquid crystal display (LCD) devices requiring a separate light source, and the like.

Display devices have been widely used in the field of applications spanning from monitors of computers and TVs to personal portable equipment. Research on display devices having a large display area and a smaller volume and weight has been conducted.

Particularly, a flexible display device has attracted attention as a next generation display device. The flexible display device is capable of displaying an image while the flexible display device is bent or folded like paper. The flexible display device uses a thin film transistor substrate made of plastic instead of glass. The flexible display device may be categorized into an unbreakable display device having a high durability, and a bendable display device, a rollable display device, and a foldable display device, without breaking. The flexible display device has advantages in use of space, interior decoration and design, and may be applied in various fields.

Meanwhile, because the foldable display device needs to be folded and unfolded, a pattern may be formed in a folding area of a substrate that supports a display panel in order to secure flexibility. In this case, the pattern can be recognized from the outside when the foldable display device is not driven.

SUMMARY

The present disclosure is to provide a foldable display device which can minimize recognition of a pattern in a folding area of a display panel.

Also, the present disclosure is to provide a foldable display device in which a structure that supports a display panel has a decrease in thickness with improved durability and impact resistance.

Further, the present disclosure is to provide a foldable display device which has a decrease in radius of curvature of a folding area with improved folding properties.

The present disclosure is not limited to the above-mentioned features, which are not mentioned above, can be clearly understood by those skilled in the art from the following descriptions.

According to an aspect of the present disclosure, the foldable display device includes a display panel including a folding area and non-folding areas on both sides of the folding area. The foldable display device also includes: a back plate disposed under the display panel; and a support substrate disposed under the back plate and made of a metal or alloy including a plurality of pores. The support substrate includes a plurality of groove patterns recessed from a bottom surface toward a top surface of the support substrate and corresponding to the folding area. Therefore, it is possible to minimize recognition of the patterns in the folding area of the display panel and improve the folding properties.

Other detailed matters of the exemplary aspects are included in the detailed description and the drawings.

According to the present disclosure, there is no need to interpose a conventional top plate between a support substrate and a back plate. Thus, it is possible to implement a foldable display device which has a decrease in thickness with improved folding properties.

Also, according to the present disclosure, the support substrate is made of a porous metal or a porous alloy. Thus, it is possible to improve durability and impact resistance.

Further, according to the present disclosure, it is possible to implement a foldable display device in which a strain is reduced during folding and the folding properties are improved by adjusting the size of pores in a support substrate.

Furthermore, according to the present disclosure, the support substrate includes a groove pattern instead of an opening pattern. Thus, it is possible to suppress recognition of the pattern in the support substrate.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
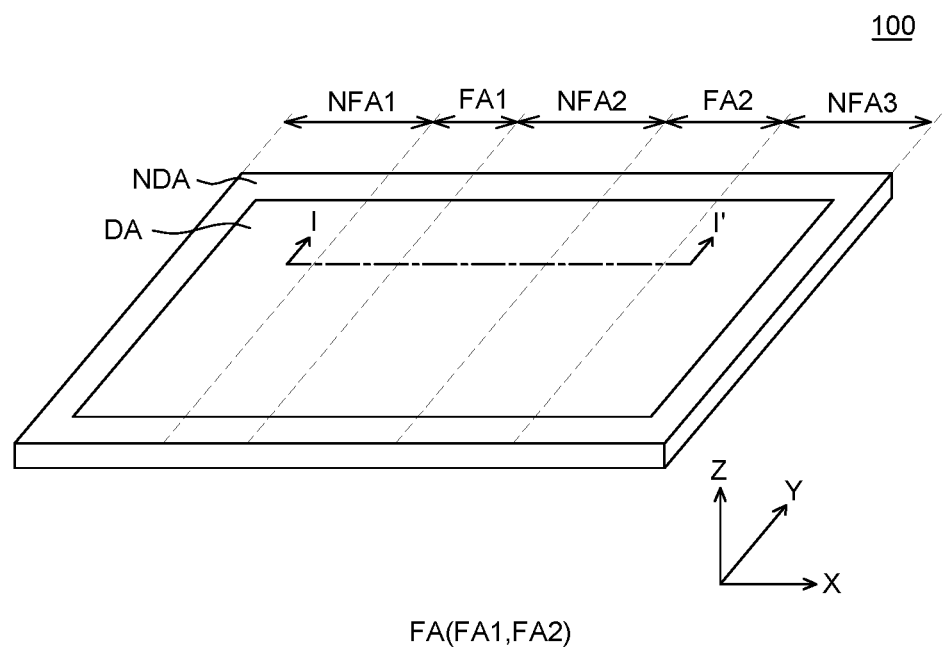
FIG. 1 is a schematic perspective view of a foldable display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, a foldable display device according to exemplary aspects of the present disclosure will be described in detail with reference to accompanying drawings.

FIG. 1 through FIG. 4B are diagrams provided to explain a foldable display device according to an exemplary aspect of the present disclosure.

Figure 2A:
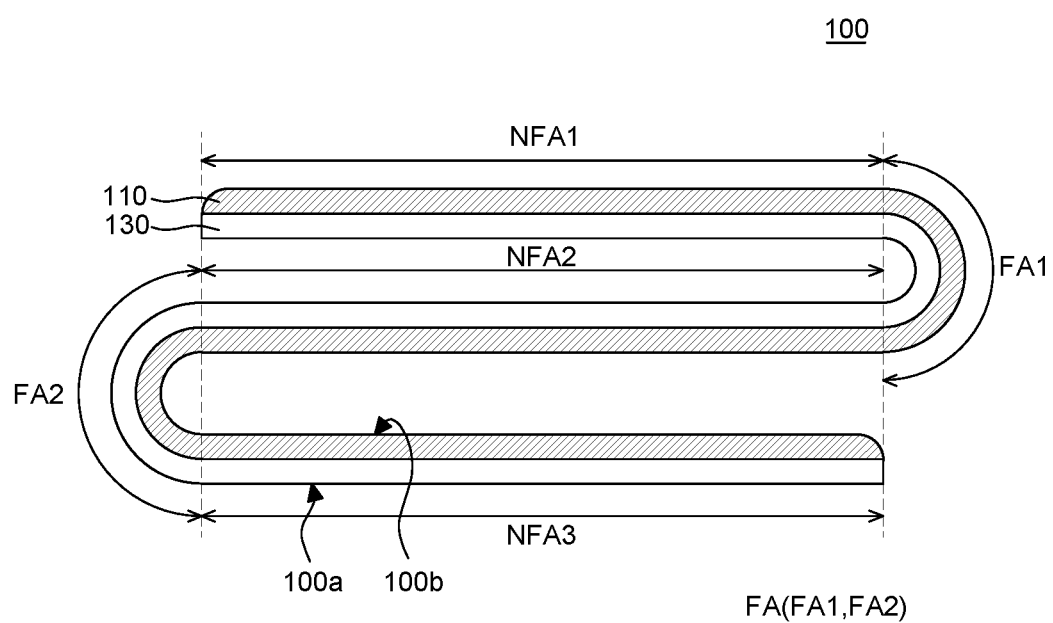
FIG. 2A is a schematic side view illustrating that one of two folding areas of the foldable display device according to an exemplary aspect of the present disclosure is folded inwards and the other is folded outwards.
Figure 2B:
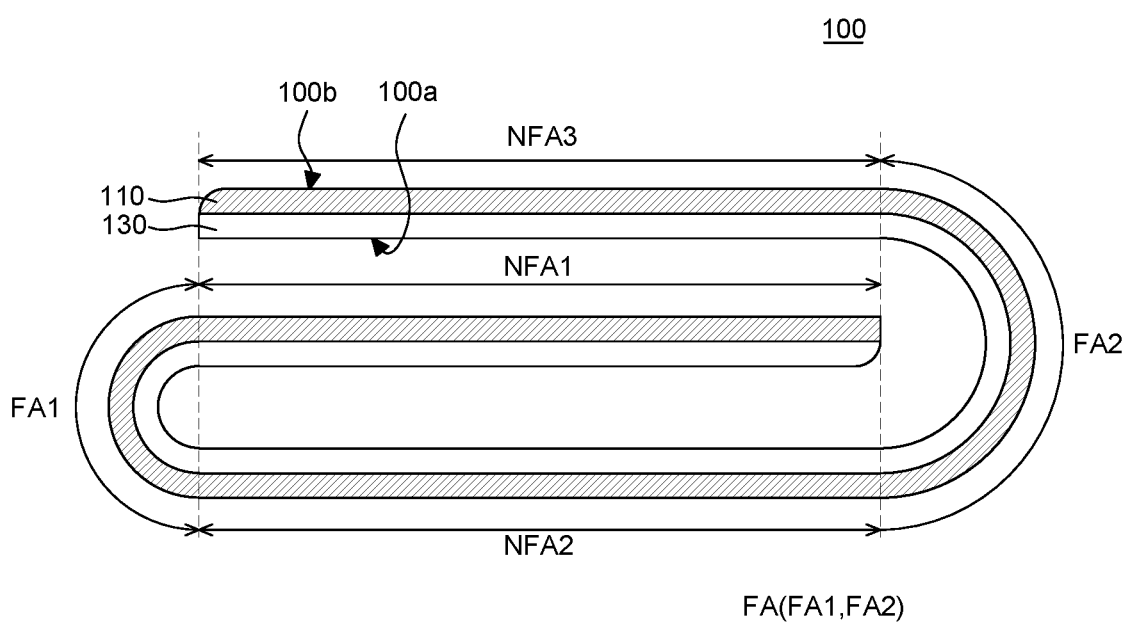
FIG. 2B is a schematic side view illustrating that the two folding areas of the foldable display device according to an exemplary aspect of the present disclosure are folded inwards.
Figure 3:
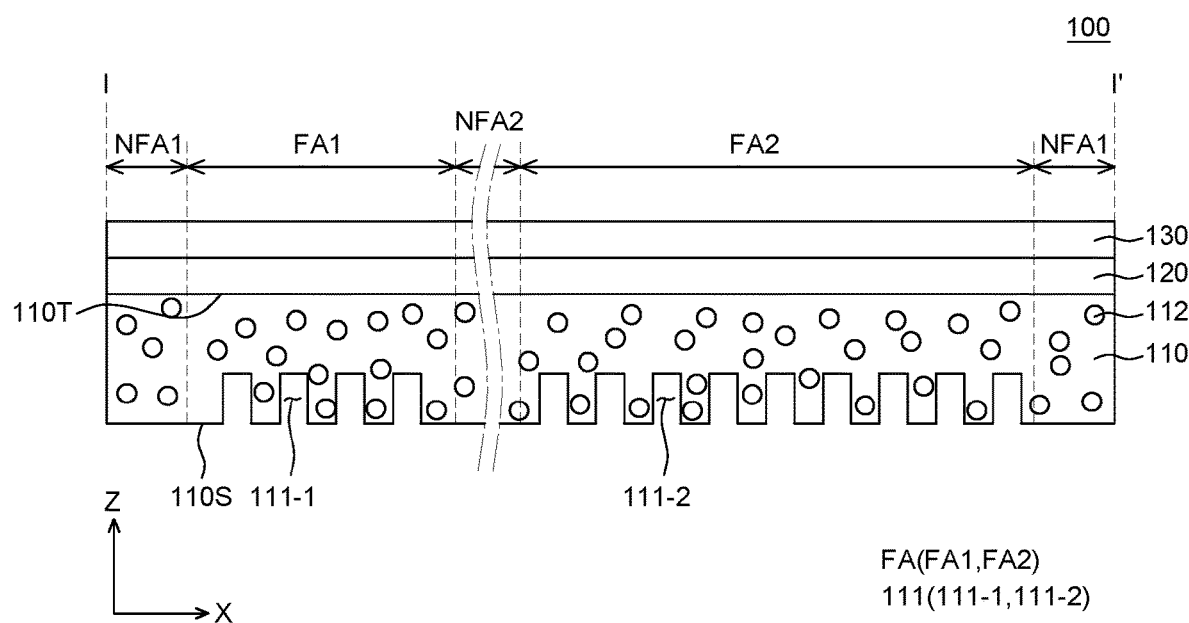
FIG. 3 is a schematic cross-sectional view as taken along a line I-I' of FIG. 1.

FIG. 1 is a schematic perspective view of a foldable display device according to an exemplary aspect of the present disclosure. FIG. 2A is a schematic side view illustrating that one of two folding areas of the foldable display device according to an exemplary aspect of the present disclosure is folded inwards and the other is folded outwards. FIG. 2B is a schematic side view illustrating that the two folding areas of the foldable display device according to an exemplary aspect of the present disclosure are folded inwards. FIG. 3 is a schematic cross-sectional view as taken along a line I-I' of FIG. 1. For the convenience of description, FIG. 2A and FIG. 2B do not illustrate a back plate 120.

A foldable display device 100 according to an exemplary aspect of the present disclosure includes a support substrate 110, the back plate 120 and a display panel 130.

Referring to FIG. 1 through FIG. 2B, the foldable display device 100 according to an exemplary aspect of the present disclosure includes a display area DA and a non-display area NDA. In the display area DA, a plurality of pixels is disposed and images are displayed. The non-display area NDA surrounds the display area DA. In the non-display area NDA, images are not displayed and various lines, driver ICs, printed circuit boards, and the like for driving the pixels and driving circuits disposed in the display area DA are disposed. For example, various ICs, such as a gate driver IC and a data driver IC, and various VSS lines may be disposed in the non-display area NDA.

Referring to FIG. 1 through FIG. 2B, the foldable display device 100 according to an exemplary aspect of the present disclosure may include one or more folding areas FA1 and FA2 and two or more non-folding areas NFA1, NFA2 and NFA3. A folding area FA is folded when the foldable display device 100 is folded. The folding area FA may be folded with a specific radius of curvature around a folding axis. The non-folding areas NFA1, NFA2 and NFA3 are not folded when the foldable display device 100 is folded. That is, the non-folding areas NFA1, NFA2 and NFA3 maintain a flat state when the foldable display device 100 is folded. The non-folding areas NFA1, NFA2 and NFA3 may be located on one side or both sides of the folding areas FA1 and FA2. For example, if the folding axis of the folding area FA is formed in a Y-axis direction, the non-folding areas NFA1, NFA2 and NFA3 are defined as areas extended from the folding area FA in an X-axis direction perpendicular to the folding axis.

FIG. 1 through FIG. 2B illustrate that the foldable display device 100 includes a first folding area FA1, a second folding area FA2, a first non-folding area NFA1, a second non-folding area NFA2 and a third non-folding area NFA3. Also, FIG. 1 through FIG. 2B illustrate that the first folding area FA1 is disposed between the first non-folding area NFA1 and the second non-folding area NFA2, and the second folding area FA2 is disposed between the second non-folding area NFA2 and the third non-folding area NFA3. However, the position of the folding area FA may vary and is not limited thereto.

When the foldable display device 100 is folded, the folding area FA is folded around the folding axis, and the folding area FA forms a part of a circle or oval. Here, the radius of curvature of the folding area FA refers to the radius of the circle or oval formed by the folding area FA. When the folding area FA is folded around the folding axis, the non-folding areas NFA1, NFA2 and NFA3 overlap each other. In the foldable display device 100, a top surface on which images are displayed is defined as a display surface 100a. A bottom surface of the foldable display device 100, which is a surface opposite to the display surface 100a, is defined as a rear surface 100b. The folding area FA may be folded in an out-folding manner in which the display surface 100a of the foldable display device 100 is folded to be exposed to the outside. Alternatively, the folding area FA may be folded in an in-folding manner in which the display surfaces 100a of the foldable display device 100 are folded to face each other.

Referring to FIG. 2A, the first folding area FA1 is folded in the in-folding manner so that the display surface 100a of the first non-folding area NFA1 and the display surface 100a of the second non-folding area NFA2 are disposed to face each other. Also, the second folding area FA2 is folded in the out-folding manner so that the rear surface 100b of the third non-folding area NFA3 and the rear surface 100b of the second non-folding area NFA2 are folded to face each other. As shown in FIG. 2A, when the first folding area FA1 and the second folding area FA2 are folded, the radius of curvature of the second folding area FA2 may be greater than the radius of curvature of the first folding area FA1.

Referring to FIG. 2B, the first folding area FA1 is folded in the in-folding manner so that the display surface 100a of the first non-folding area NFA1 and the display surface 100a of the second non-folding area NFA2 are disposed to face each other. Also, the second folding area FA2 is folded in the in-folding manner so that the first non-folding area NFA1 is located between the second non-folding area NFA2 and the third non-folding area NFA3. Also, the display surface 100a of the third non-folding area NFA3 and the rear surface 100b of the first non-folding area NFA1 are folded to face each other. As shown in FIG. 2B, when the first folding area FA1 and the second folding area FA2 are folded, the radius of curvature of the second folding area FA2 may be greater than the radius of curvature of the first folding area FA1.

Referring to FIG. 1 through FIG. 2B, the display panel 130 is a panel in which images are implemented. Display elements for implementing images, circuit units for driving the display elements, and the like may be disposed in the display panel 130. For example, if the foldable display device 100 is an OLED device, the display elements may include organic light emitting elements. Hereinafter, for the convenience of description, it is assumed that the foldable display device 100 according to various exemplary aspects of the present disclosure is a foldable OLED device including organic light emitting elements. However, the present disclosure is not limited thereto.

The circuit units may include various thin film transistors, capacitors, lines, driver ICs, and the like for driving the organic light emitting elements. For example, the circuit units may include various components such as a driving thin film transistor, a switching thin film transistor, a storage capacitor, a gate line, a data line, a gate driver IC and a data driver IC, but are not limited thereto.

Specifically, in the foldable display device 100, the display panel 130 includes a flexible substrate having a very small thickness to implement flexibility. The flexible substrate may be an insulating plastic substrate made of a flexible insulating material selected from, for example, polyimide, polyethersulfone, polyethylene terephthalate and polycarbonate.

The back plate 120 is disposed under the display panel 130 and supports the display panel 130. Since a substrate of the display panel 130 is thin, the back plate 120 supports the display panel 130 together with the support substrate 110. Thus, the rigidity of the entire foldable display device 100 is improved. When the foldable display device 100 is folded, the back plate 120 uniformly maintains the radius of curvature of the display panel 130 and suppresses the occurrence of creases on a top surface of the display panel 130. The back plate 120 is disposed between the support substrate 110 and the display panel 130 and may be made of a transparent organic material.

The support substrate 110 is disposed under the back plate 120 and may be referred to as a bottom plate. Like the back plate 120, the support substrate 110 also supports the display panel 130.

The support substrate 110 may be made of metal materials such as stainless steel (SUS), SUS containing another metal such as nickel (Ni), Invar, iron (Fe), aluminum (Al) or magnesium (Mg). For example, the support substrate may be made of SUS, and SUS has a high restoring force and a high rigidity. Thus, even when the support substrate 110 decreases in thickness, a certain degree of rigidity may be maintained. In the foldable display device 100 according to an exemplary aspect of the present disclosure, the support substrate 110 may be made of a metal or alloy including a plurality of pores 112.

Herein, the metal or alloy including the plurality of pores 112 is referred to as metal foam. For example, the support substrate 110 may be made of SUS foam, but is not limited thereto.

A typical metal plate without including pores has an opening pattern and the size of voids of the opening pattern is increased or the thickness of the metal plate is decreased to decrease the radius of curvature. However, in this case, the durability and impact resistance of the metal plate may decrease. To solve this problem, a support substrate 110 of a foldable display device 100 according to an exemplary aspect of the present disclosure includes a plurality of pores 112. Due to the plurality of pores 112, it is possible to maintain the durability of the support substrate 110 and decrease the radius of curvature without manufacturing the support substrate to an excessively small thickness.

The size of the plurality of pores 112 may be in the range of from 50 nm to 10 μm. When this range is satisfied, the durability of the support substrate 110 may be maintained. Herein, the size of pores refers to the mean diameter of pores. As the size of pores increases within an allowable range, a strain reduction rate may increase. The radius of curvature of the folding area FA of the support substrate 110 may be regulated by regulating the size of pores. The plurality of pores 112 may be different in size between the first folding area FA1 and the second folding area FA2 or between an upper region and a lower region of the support substrate 110. The difference in size of the plurality of pores 112 between the upper region and the lower region will be described below in detail.

The plurality of pores 112 may be different in size between the first folding area FA1 and the second folding area FA2 which are different from each other in radius of curvature. This is to improve a strain reduction rate in a folding area applied with a relatively high strain by regulating the size of pores in the folding area. In this case, a difference between folding areas in strain applied to a support substrate depending on the radius of curvature during folding is considered.

For example, FIG. 3 illustrates that the size of the plurality of pores 112 have the same size in any region, but the size of pores may be different depending on the radius of curvature of the folding area FA. For example, a plurality of pores in the first folding area FA1 having a relatively small radius of curvature may be greater in size than a plurality of pores in the second folding area FA2. Since a strain reduction rate increases as the size of pores increases, the size of pores in the first folding area FA1 applied with a relatively high strain during folding is set to be greater than the size of pores in the second folding area FA2 to improve a strain reduction rate in the first folding area FA1. Therefore, a strain applied to the entire folding area FA may be minimized.

Referring to FIG. 3, the plurality of pores 112 is disposed to suppress formation of grooves in a top surface 110T of the support substrate by the pores. This is to suppress recognition of the grooves formed by the pores from the outside like a plurality of groove patterns 111. Meanwhile, grooves may be formed by the pores in a bottom surface 110S of the support substrate.

Unlike the plurality of groove patterns 111, the plurality of pores 112 may be disposed through the folding area FA and the non-folding areas NFA1, NFA2 and NFA3.

Referring to FIG. 3, the plurality of groove patterns 111 corresponding to the folding area FA may be formed in the support substrate 110. FIG. 3 illustrates that the plurality of groove patterns 111 has a predetermined height in a Z-axis direction, but the present disclosure is not limited thereto. Optionally, the height of one of the groove patterns may be changed to be different from that of another groove pattern adjacent thereto.

Hereinafter, the plurality of groove patterns 111 will be described in more detail with reference to FIG. 4A and FIG. 4B.

Figure 4A:
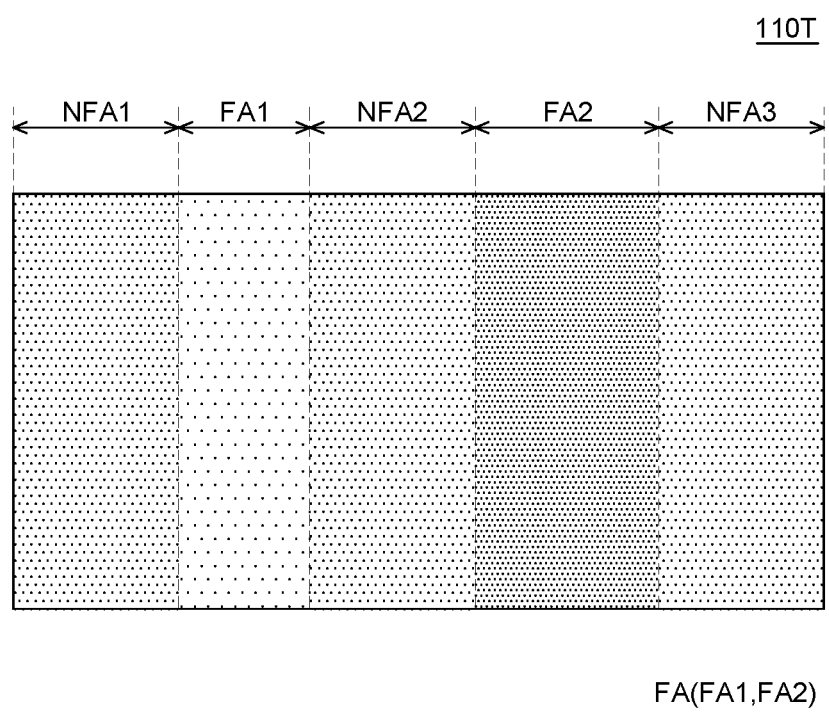
FIG. 4A is a schematic plan view showing a top surface of a support substrate constituting the foldable display device according to an exemplary aspect of the present disclosure.

FIG. 4A is a schematic plan view showing a top surface of a support substrate constituting the foldable display device according to an exemplary aspect of the present disclosure. FIG. 4B is a schematic plan view showing a bottom surface of the support substrate constituting the foldable display device according to an exemplary aspect of the present disclosure. For the convenience of description of a plurality of groove patterns, FIG. 4B shows a plan view in which grooves that may be formed by a plurality of pores in the bottom surface of the support substrate are omitted.

If an opening pattern is formed through the support substrate to improve the folding properties of the foldable display device, the opening pattern may be transferred and recognized from the outside. Also, grooves formed by the opening pattern in the top surface of the support substrate may cause a decrease in adhesive strength with an adhesive layer on the support substrate. To solve this problem, a separate top plate needs to be disposed on the support substrate, which results in an increase in thickness of the layers under the display panel and a deterioration in the folding properties. In the display device 100 according to an exemplary aspect of the present disclosure, the support substrate 110 includes the plurality of groove patterns 111 instead of an opening pattern. Thus, recognition of the opening pattern from the outside does not occur. Also, the top surface 110T of the support substrate is flat, and, thus, there is no need for a separate top plate. Therefore, the thickness of the layers under the display panel 130 may be decreased and the folding properties may be improved.

Referring to FIG. 4A, the plurality of groove patterns 111 is not formed through the support substrate unlike the opening pattern. The plurality of groove patterns 111 is recessed from a bottom surface 110S of the support substrate 110 toward a top surface 110T of the support substrate. Therefore, the top surface 110T of the support substrate may be flat.

Due to the plurality of groove patterns 111, the support substrate 110 may have folding properties equivalent or similar to those of a support substrate including an opening pattern. Also, the top surface 110T of the support substrate may be maintained in a flat state. Thus, recognition of the groove patterns 111 from the outside does not occur. Therefore, there is no need for a separate top plate to cover the support substrate 110. Accordingly, the thickness of the layers under the display panel 130 may be decreased.

Meanwhile, if only the plurality of groove patterns 111 is disposed in the support substrate 110 as a metal plate without including a plurality of pores, the size of voids of the patterns needs to be increased or the thickness of the metal plate needs to be decreased to decrease the radius of curvature. In this case, the durability or impact resistance of the support substrate may be decreased. However, as shown in FIG. 3, the support substrate 110 may be made of metal foam and may include the plurality of pores 112 as well as the plurality of groove patterns 111. In this case, the durability of the support substrate 110 may be maintained and an external stress generated during folding may be decreased by regulating the size or number of the plurality of pores 112 without regulating the thickness of the plurality of groove patterns 111 or the support substrate 110. Also, the folding properties may be improved by regulating the radius of curvature.

Figure 4B:
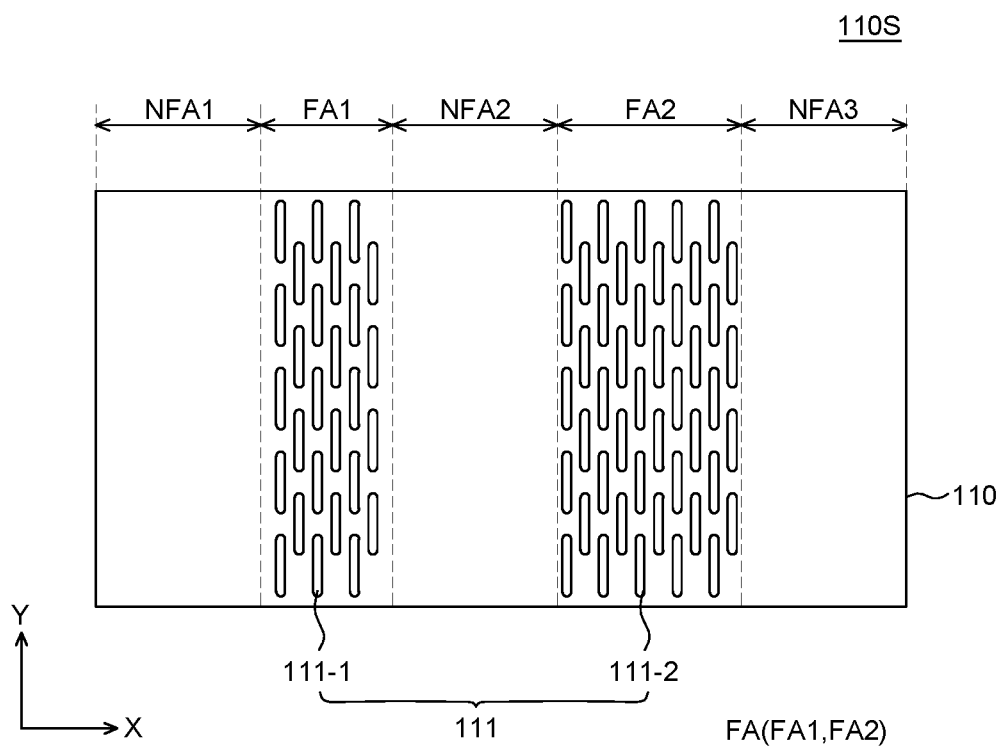
FIG. 4B is a schematic plan view showing a rear surface of the support substrate constituting the foldable display device according to an exemplary aspect of the present disclosure.

Referring to FIG. 4B, the plurality of groove patterns 111 is disposed in a plurality of columns in each folding area FA. Each of the plurality of groove patterns 111 is disposed to be spaced apart at a predetermined distance from another adjacent groove pattern 111 in a row direction. For example, if each of the plurality of groove patterns 111 has an oval shape, each of the plurality of groove patterns 111 has a major axis passing through the center thereof along the Y-axis direction. This means that the distance between a Y-axis passing through the center of one groove pattern and a Y-axis passing through the center of another adjacent groove pattern is constant. FIG. 4B illustrates an exemplary aspect of the present disclosure, but the present disclosure is not limited thereto. Each of the plurality of groove patterns 111 may have a rectangular or diamond shape.

Also, each of the plurality of groove patterns 111 has a minor axis passing through the center thereof along the X-axis direction. The length of the minor axis refers to the width in the row direction. Further, each of the plurality of groove patterns 111 has a major axis passing through the center thereof along the Y-axis direction. The length of the major axis refers to the width in the column direction. The minor axes of the plurality of groove patterns 111 may be identical to or different from each other in length. Here, the length of the minor axis of each of the plurality of groove patterns 111 may be 1.0 to 2.0 times or 1.3 to 1.7 times greater than the thickness of the support substrate. Otherwise, the length of the minor axis of each of the plurality of groove patterns 111 may be 1.5 to 3 times greater than the size of the plurality of pores 112. The folding properties may be improved by regulating the size or number of a plurality of pores in the support substrate 110 without excessively increasing the lengths of the minor axis of the plurality of groove patterns 111.

Also, the major axes of the plurality of groove patterns 111 may be identical to or different from each other in length. Here, the length of the major axis of each of the plurality of groove patterns 111 may be 1 mm to 5 mm.

Specifically, the length of the major axis of each of the plurality of groove patterns 111 may be 2.5 mm to 4.5 mm, but is not limited thereto. As the length of the major axis of each of the plurality of groove patterns 111 increases, the folding properties are improved. However, the length of the major axis of each of the plurality of groove patterns 111 may be determined within a range in which the patterns may not be recognized from the outside.

The thickness of the support substrate 110 may be 20 μm to 100 μm, specifically, 30 μm to 80 μm. If the thickness of the support substrate 110 is in this range, the support substrate 110 may be folded while maintaining rigidity and support performance.

Thus, in the foldable display device 100 according to an exemplary aspect of the present disclosure, the support substrate 110 includes the plurality of groove patterns 111 and the plurality of pores 112. Specifically, the support substrate 110 includes the plurality of groove patterns 111 recessed from the bottom surface 110S toward the top surface 110T of the support substrate 110 as compared with a support substrate including an opening pattern. Thus, recognition of the patterns from the outside does not occur, and grooves are not formed in the top surface of the support substrate. Therefore, the back plate 120 may be disposed directly on the support substrate 110 without a separate top plate. Thus, it is possible to decrease the thickness of the layers under the display panel 130 and reduce the cost required for manufacturing an additional top plate. Further, since the support substrate 110 includes the plurality of pores 112, it is possible to decrease the radius of curvature and improve the folding properties without including an opening pattern or excessively increasing the size of voids of the patterns. Also, it is possible to improve the durability and impact resistance. Furthermore, the size of the plurality of pores 112 is regulated depending on the radius of curvature of the folding area FA. Thus, it is possible to efficiently reduce a strain or stress generated during folding.

Figure 5:
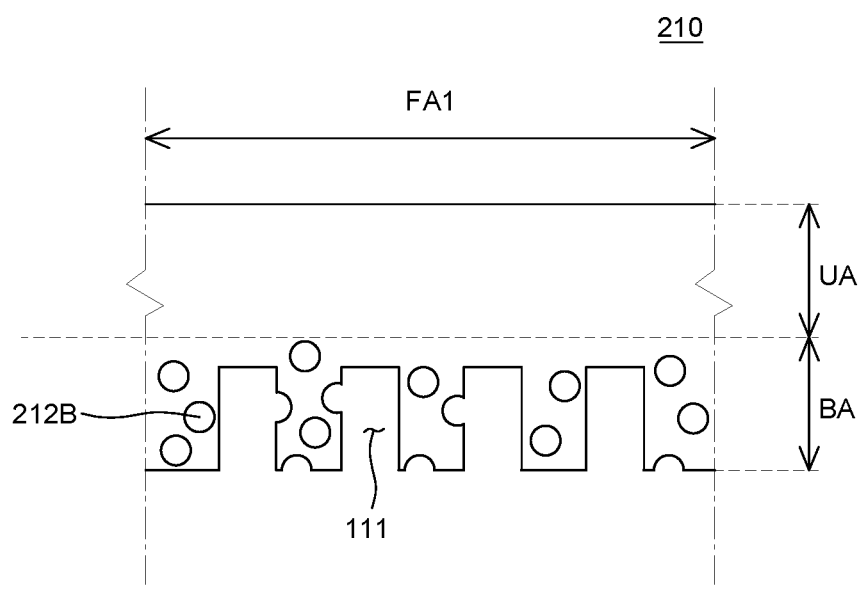
FIG. 5 is a cross-sectional view showing a portion of a support substrate constituting a foldable display device according to another exemplary aspect of the present disclosure.

FIG. 5 is a schematic cross-sectional view showing a portion of a support substrate constituting a foldable display device according to another exemplary aspect of the present disclosure.

FIG. 5 shows only a cross-sectional view of the first folding area FA1 for the convenience of illustration. A foldable display device shown in FIG. 5 has substantially the same configuration as the foldable display device 100 shown in FIG. 1 through FIG. 4B except for a plurality of pores 212B in a support substrate 210. Thus, a repeated description will be omitted.

Referring to FIG. 5, the support substrate 210 includes the plurality of groove patterns 111 and the plurality of pores 212B. For example, the plurality of groove patterns 111 has a constant height and width and is spaced apart at a predetermined distance from each other, but the height and width may be optionally regulated. As described above, the plurality of pores 212B may be different in size between the first folding area FA1 and the second folding area FA2. The support substrate 210 may be divided into an upper region UA and a lower region BA. Specifically, the upper region UA and the lower region BA may be divided based on a reference line at a height corresponding to about half the height of the support substrate.

Unlike the example shown in FIG. 3, the plurality of pores 212B may not be disposed in the upper region UA of the support substrate 210 but may be disposed only in the lower region BA. For example, if the plurality of groove patterns 111 has a depth sufficient to secure the folding properties, the plurality of pores 212B may be disposed only in the lower region BA to secure the durability or impact resistance of the support substrate 210. The radius of curvature may be changed by regulating the size or number of pores in the lower region BA. Therefore, optionally, the plurality of pores 212B may be disposed only in the lower region BA.

Thus, in the foldable display device according to another exemplary aspect of the present disclosure, the plurality of pores 212B is disposed in the lower region BA of the support substrate 210. Therefore, recognition of the patterns from the outside does not occur, and the folding properties may be improved.

Figure 6:
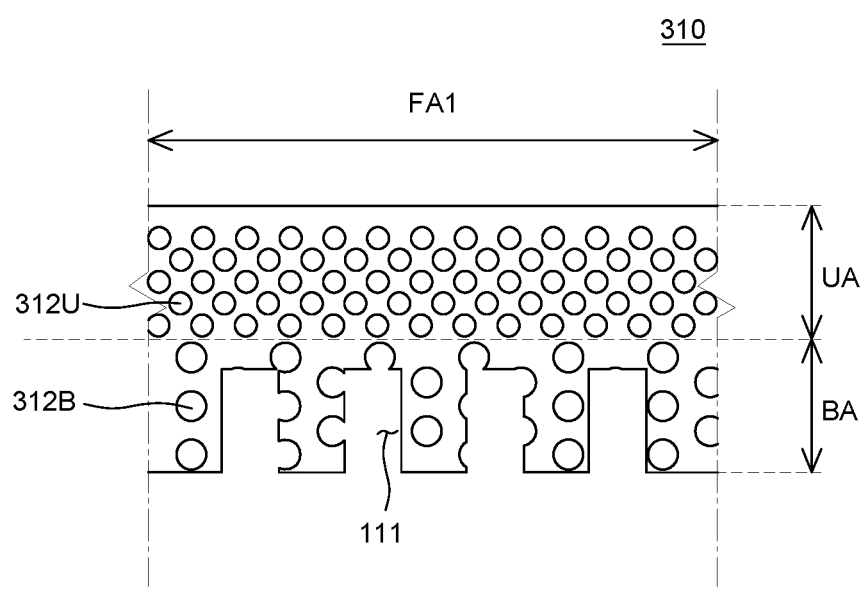
FIG. 6 is a schematic cross-sectional view showing a portion of a support substrate constituting a foldable display device according to yet another exemplary aspect of the present disclosure.

FIG. 6 is a schematic cross-sectional view showing a portion of a support substrate constituting a foldable display device according to yet another exemplary aspect of the present disclosure.

FIG. 6 shows only a cross-sectional view of the first folding area FA1 for the convenience of illustration. A foldable display device shown in FIG. 6 has substantially the same configuration as the foldable display device 100 shown in FIG. 1 through FIG. 4B except for the size and placement of a plurality of pores 312U and 312B in a support substrate 310. Thus, a repeated description will be omitted.

Referring to FIG. 6, the support substrate includes the plurality of groove patterns 111 and the plurality of pores 312U and 312B. For example, the plurality of groove patterns 111 has a constant height and width and is spaced apart at a predetermined distance from each other, but the height and width may be optionally regulated. As described above, the plurality of pores 312U and 312B may be different in size between the first folding area FA1 and the second folding area FA2. Unlike the example shown in FIG. 3, the plurality of pores 312U in the upper region UA may be smaller in size than the plurality of pores 312B in the lower region BA. The upper region UA may also include the plurality of pores 312U and 312B to decrease the radius of curvature of the support substrate 310. However, in order to suppress recognition of a pattern from the outside, the plurality of pores 312U smaller in size than the plurality of pores 312B of the lower region BA may be optionally disposed in the upper region UA.

Thus, in the foldable display device according to yet another exemplary aspect of the present disclosure, the plurality of pores 312U and 312B different in size is disposed in each of the upper region UA and the lower region BA of the support substrate 310. Therefore, recognition of the patterns from the outside may be minimized, and the folding properties may be improved.

Figure 7:
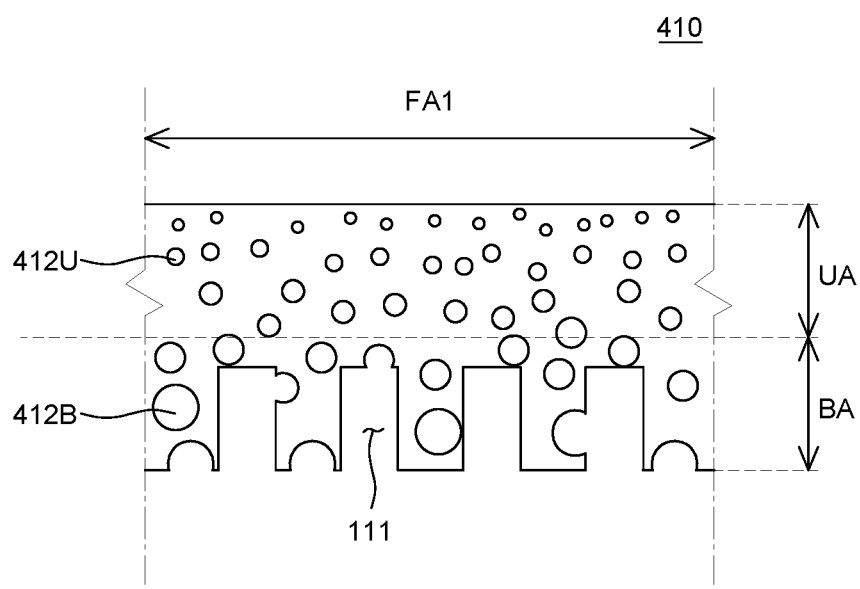
FIG. 7 is a schematic cross-sectional view showing a portion of a support substrate constituting a foldable display device according to still another exemplary aspect of the present disclosure.

FIG. 7 is a schematic cross-sectional view showing a portion of a support substrate constituting a foldable display device according to still another exemplary aspect of the present disclosure.

FIG. 7 shows only a cross-sectional view of the first folding area FA1 for the convenience of illustration. A foldable display device shown in FIG. 7 has substantially the same configuration as the foldable display device 100 shown in FIG. 1 through FIG. 4B except for the size and placement of a plurality of pores 412U and 412B in a support substrate 410. Thus, a repeated description will be omitted.

Referring to FIG. 7, the support substrate 410 includes the plurality of groove patterns 111 and the plurality of pores 412U and 412B. For example, the plurality of groove patterns 111 has a constant height and width and is spaced apart at a predetermined distance from each other, but the height and width may be optionally regulated. As described above, the plurality of pores 412U and 412B may be different in size between the first folding area FA1 and the second folding area FA2. Unlike the example shown in FIG.

3, the plurality of pores 412U and 412B may gradually increase in size from the upper region UA toward the lower region BA. Similar to the example shown in FIG. 6, the plurality of pores 412U in the upper region UA may be smaller in size than the plurality of pores 412B in the lower region BA. Also, to reduce a strain applied to a region of the upper region UA adjacent to the plurality of groove patterns 111 during folding, the size of the plurality of pores 412U and 412B may be changed to increase from the upper region toward the lower region.

Thus, in the foldable display device according to still another exemplary aspect of the present disclosure, the plurality of pores 412U and 412B gradually increases in size from the upper region UA toward the lower region BA of the support substrate 410. Therefore, a strain may be reduced and the folding properties may be improved during folding.

Hereinafter, the effects of the present disclosure will be described in more detail with reference to exemplary aspects, reference aspects and comparative aspects. However, the following aspects are provided for the purpose of illustration, but the present disclosure is not limited thereto.

A change in stress or strain applied to a support substrate sample of the foldable display device shown in FIG. 3 depending on a change in length of a major axis of a plurality of groove patterns formed in the support substrate sample was checked.

In Aspect 1 through Aspect 3, the distance between a groove pattern and another adjacent groove pattern formed in the support substrate sample was fixed to 170 μm. Then, the length of a minor axis of each groove pattern was fixed to 130 μm, and the length of a major axis of each groove pattern was changed as shown in the following Table 1. Thereafter, the maximum values of a stress and a strain applied to the support substrate during folding were measured. The result was as shown in the following Table 1.

TABLE 1

|  | Major axis length (mm) | Stress maximum value (GPa) | Strain maximum value (%) |
| --- | --- | --- | --- |
| Aspect 1 | 3.0 | 1.21 | 0.68 |
| Aspect 2 | 4.0 | 0.98 | 0.55 |
| Aspect 3 | 4.4 | 0.91 | 0.51 |

Referring to Table 1, as the length of the major axis increased, the maximum values of the stress and the strain tended to decrease. Accordingly, it can be inferred that the stress or strain formed in the folding area may be reduced by changing the length of the minor axis or major axis of the plurality of groove patterns within a predetermined range, and, thus, the radius of curvature may be regulated.

Further, the length of a minor axis and the length of a major axis of each first groove pattern 111-1 formed in the first folding area are constant and the length of a minor axis and the length of a major axis of each second groove pattern 111-2 formed in the second folding area are constant. However, the length of the minor axis and the length of the major axis of each first groove pattern 111-1 may be different from each other, and the length of the minor axis and the length of the major axis of each the second groove pattern 111-2 may be different from each other.

Hereinafter, to check a difference in effect depending on the presence or absence of a plurality of pores in a support substrate, the density, modulus and Poisson's ratio were analyzed through a folding simulation of an SUS plate (Comparative Aspect) and an SUS foam (Reference Aspect). The result was as shown in the following Table 2.

Reference Aspect is an SUS foam having a thickness of about 30 μm and including a plurality of pores having a diameter of about 2 μm. Comparative Aspect is an SUS plate having a thickness of about 30 μm without including a plurality of groove patterns and a plurality of pores. The density, modulus and Poisson's ratio of Reference Example and Comparative Example were measured.

TABLE 2

|  | Density (Tonne/mm$^3$) | Modulus (MPa) | Poisson's ratio |
| --- | --- | --- | --- |
| Comparative Example (SUS plate) | 7.86E−9 | 193000 | 0.27 |
| Reference Example (SUS foam) | 0.786E−19 | 50000 | 0.27 |

Referring to Table 2, it was confirmed that the Poisson's ratio of the SUS foam sample including pores was similar to that of the SUS plate. That means that when tensile force is applied to the SUS foam and the SUS plate, a horizontal strain rate with respect to a longitudinal direction is constant regardless of the presence or absence of pores.

Meanwhile, as for the density and modulus, Reference Aspect showed a lower modulus than Comparative Aspect. Therefore, it can be seen that the SUS foam including a plurality of pores is more flexible and thus may disperse an external stress.

According to the result of a folding simulation of foldable display devices including the support substrates of Reference Example and Comparative Example, respectively, a distribution of strain applied to the sample was about −1.57% to about 1.35% in the SUS plate. Also, a distribution of strain applied to the sample was about −1.49% to about 1.28% in the SUS foam. As compared with the SUS plate, the SUS foam showed a strain reduction effect of about 5%.

In the foldable display device 100 including the support substrate 110 as shown in FIG. 3, the support substrate 110 includes the plurality of pores 112. Therefore, it is confirmed that a strain or stress may be reduced and the folding properties may be improved during folding.

Hereinafter, a distribution of strain was analyzed through a folding simulation of a foldable display device sample including a support substrate including a plurality of pores and a plurality of groove patterns.

In Example 4, a support substrate sample was manufactured. The support substrate sample included a lower region having a thickness of about 15 μm and an upper region having a thickness of about 15 μm as shown in FIG. 5. A plurality of groove patterns having a minor axis length of about 5 μm, a distance of about 5 μm and a height of about 15 μm was formed in the lower region. Only the lower region was made of SUS foam including pores having a diameter of about 2 μm.

In Aspect 5, a support substrate sample was manufactured. The support substrate sample included a lower region having a thickness of about 15 μm and an upper region having a thickness of about 15 μm as shown in FIG. 6. A plurality of groove patterns having a minor axis length of about 5 μm, a distance of about 5 μm and a height of about 15 μm was formed in the lower region. The lower region was made of SUS foam including pores having a diameter of about 2 μm and the upper region was made of SUS foam including pores having a diameter of about 1 μm. According to the result of a folding simulation of the support substrates of Aspect 4 and Aspect 5, respectively, a distribution of strain in Aspect 4 was about −1.48% to about 1.32%. Also, a distribution of strain in Aspect 5 was about −1.42% to about 1.26%.

As compared with Experimental Aspect 2 in which the distribution of strain was about −1.57% to about 1.35%, Aspect 4 and Aspect 5 showed a strain reduction effect of about 10%. As compared with Reference Aspect, Aspect 4 and Aspect 5 showed a strain reduction effect of about 5%. Also, Aspect 5 showed a greater strain reduction effect than Aspect 4. This is because the upper region of the support substrate including pores without groove patterns has an additional strain reduction effect.

Accordingly, it can be seen that the addition of a plurality of groove patterns to the support substrate including a plurality of pores generates a synergy effect in minimizing a strain applied to the support substrate.

The exemplary aspects of the present disclosure can also be described as follows:

According to an aspect of the present disclosure, there is provided a foldable display device. The foldable display device includes a display panel including a folding area and non-folding area on both sides of the folding area. The foldable display device further includes a back plate disposed under the display panel. The foldable display device further includes a support substrate disposed under the back plate and made of a metal or alloy including a plurality of pores. The support substrate includes a plurality of groove patterns recessed from a bottom surface toward a top surface of the support substrate and corresponding to the folding area.

The top surface of the support substrate may be flat.

The folding area may include a first folding area and a second folding area having a greater radius of curvature than the first folding area. the plurality of pores included in the support substrate and corresponding to the first folding area may be greater in size than the plurality of pores included in the support substrate and corresponding to the second folding area.

The support substrate may include an upper region and a lower region. The plurality of pores may be disposed only in the lower region.

The support substrate may include an upper region and a lower region. The plurality of pores may be disposed in the upper region and the lower region. The pores in the upper region may be smaller in size than the pores in the lower region.

The plurality of pores gradually may increase in size as being away from the upper region of the support substrate.

The plurality of pores may have a diameter of 50 nm to 10 μm.

The plurality of groove patterns may be disposed in a plurality of columns between the non-folding areas on the both sides. Each of the plurality of groove patterns may be spaced apart at a predetermined distance from another adjacent groove pattern in a row direction.

Each of the plurality of groove patterns may be different in height from another adjacent groove pattern in the row direction.

The support substrate may have a thickness of 20 μm to 100 μm.

The non-folding areas may include a first non-folding area, a second non-folding area and a third non-folding area. The folding area may include a first folding area that is located between the first non-folding area and the second non-folding area and folded in an in-folding manner in which a display surface of the display panel faces inwards and a second folding area that is located between the second non-folding area and the third non-folding area and folded in an out-folding manner in which the display surface of the display panel faces outwards.

The non-folding areas may include a first non-folding area, a second non-folding area and a third non-folding area. The first non-folding area may be located between the second non-folding area and the third non-folding area. The folding area may include a first folding area that is located between the first non-folding area and the second non-folding area and folded in an in-folding manner in which a display surface of the display panel faces inwards and a second folding area that is located between the second non-folding area and the third non-folding area and folded in an in-folding manner in which the display surface of the display panel faces inwards.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A foldable display device, comprising:
   a display panel including a folding area and a non-folding area disposed on both sides of the folding area;
   a back plate disposed under the display panel; and
   a support substrate disposed under the back plate and made of a porous metal or a porous alloy including a plurality of pores,
   wherein the support substrate includes a plurality of groove patterns recessed from a bottom surface toward a top surface of the support substrate and corresponding to the folding area,
   each of the plurality of pores is randomly distributed in the support substrate to form a porous structure,
   wherein the support substrate includes an upper region and a lower region,
   wherein the plurality of pores is disposed in the upper region and the lower region, and
   wherein the pores in the upper region are smaller in size than the pores in the lower region.

2. The foldable display device according to claim 1, wherein the top surface of the support substrate is flat.

3. The foldable display device according to claim 1, wherein the folding area includes a first folding area and a second folding area having a greater radius of curvature than that of the first folding area, and
   wherein the plurality of pores included in the support substrate and corresponding to the first folding area is greater in size than the plurality of pores included in the support substrate and corresponding to the second folding area.

4. The foldable display device according to claim 1, wherein the plurality of pores gradually increases in size as being away from the upper region of the support substrate.

5. The foldable display device according to claim 1, wherein the plurality of pores has a diameter of 50 nm to 10 µm.

6. The foldable display device according to claim 1, wherein the plurality of groove patterns is disposed in a plurality of columns between the non-folding areas on both sides, and
each of the plurality of groove patterns is spaced apart with a predetermined distance from another adjacent groove pattern in a row direction.

7. The foldable display device according to claim 6, wherein each of the plurality of groove patterns is different in height from another adjacent groove pattern in the row direction.

8. The foldable display device according to claim 1, wherein the support substrate has a thickness of 20 µm to 100 µm.

9. The foldable display device according to claim 1, wherein the non-folding areas include a first non-folding area, a second non-folding area and a third non-folding area, and
wherein the folding area includes a first folding area that is located between the first non-folding area and the second non-folding area and folded in an in-folding manner in which a display surface of the display panel faces inwards and a second folding area that is located between the second non-folding area and the third non-folding area and folded in an out-folding manner in which the display surface of the display panel faces outwards.

10. The foldable display device according to claim 1, wherein the non-folding areas include a first non-folding area, a second non-folding area and a third non-folding area,
wherein the first non-folding area is located between the second non-folding area and the third non-folding area, and
wherein the folding area includes a first folding area that is located between the first non-folding area and the second non-folding area and folded in an in-folding manner in which a display surface of the display panel faces inwards and a second folding area that is located between the second non-folding area and the third non-folding area and folded in an in-folding manner in which the display surface of the display panel faces inwards.

11. A foldable display device, comprising:
a display panel including a first folding area, a second folding area, a first non-folding area, a second non-folding area and a third non-folding area;
a back plate disposed under the display panel; and
a support substrate disposed under the back plate and made of a porous metal or a porous alloy including a plurality of pores and including a plurality of groove patterns recessed from a bottom surface toward a top surface of the support substrate and corresponding to the folding area,
wherein each of the plurality of pores is randomly distributed in the support substrate to form a porous structure,
wherein the first folding area is located between the first non-folding area and the second non-folding area and folded in an in-folding manner in which a display surface of the display panel faces inwards,
wherein the second folding area has a greater radius of curvature than that of the first folding area and is located between the second non-folding area and the third non-folding area and folded in an out-folding manner in which the display surface of the display panel faces outwards,
wherein the support substrate includes an upper region and a lower region,
wherein the plurality of pores is disposed in the upper region and the lower region, and
wherein the pores in the upper region are smaller in size than the pores in the lower region.

12. The foldable display device according to claim 11, wherein the plurality of pores included in the support substrate and corresponding to the first folding area is greater in size than the plurality of pores included in the support substrate and corresponding to the second folding area.

13. The foldable display device according to claim 11, wherein the plurality of pores gradually increases in size as being away from the upper region of the support substrate.

14. A foldable display device, comprising:
a display panel including a first folding area, a second folding area, a first non-folding area, a second non-folding area and a third non-folding area;
a back plate disposed under the display panel; and
a support substrate disposed under the back plate and made of a porous metal or a porous alloy including a plurality of pores and including a plurality of groove patterns recessed from a bottom surface toward a top surface of the support substrate and corresponding to the folding area,
wherein each of the plurality of pores is randomly distributed in the support substrate to form a porous structure,
wherein the first folding area is located between the first non-folding area and the second non-folding area and folded in an in-folding manner in which a display surface of the display panel faces inwards,
wherein the second folding area has a greater radius of curvature than that of the first folding area and is located between the second non-folding area and the third non-folding area and folded in an out-folding manner in which the display surface of the display panel faces outwards,
wherein the support substrate includes an upper region and a lower region, and
wherein the plurality of pores is disposed only in the lower region.

15. A foldable display device, comprising:
a display panel including a first folding area, a second folding area, a first non-folding area, a second non-folding area and a third non-folding area;
a back plate disposed under the display panel; and
a support substrate disposed under the back plate and made of a porous metal or a porous alloy including a plurality of pores and including a plurality of groove patterns recessed from a bottom surface toward a top surface of the support substrate and corresponding to the folding area,
wherein each of the plurality of pores is randomly distributed in the support substrate to form a porous structure,
wherein the first folding area is located between the first non-folding area and the second non-folding area and folded in an in-folding manner in which a display surface of the display panel faces inwards,
wherein the second folding area has a greater radius of curvature than that of the first folding area and is located between the second non-folding area and the third non-folding area and folded in an out-folding manner in which the display surface of the display panel faces outwards,
wherein the plurality of groove patterns is disposed in a plurality of columns among the first and second folding areas, and
each of the plurality of groove patterns is spaced apart with a predetermined distance from another adjacent groove pattern in a row direction.

16. The foldable display device according to claim 15, wherein each of the plurality of groove patterns is different in height from another adjacent groove pattern in the row direction.

17. A foldable display device, comprising:
a display panel including a folding area and a non-folding area disposed on both sides of the folding area;
a back plate disposed under the display panel; and
a support substrate disposed under the back plate and made of a porous metal or a porous alloy including a plurality of pores,
wherein the support substrate includes a plurality of groove patterns recessed from a bottom surface toward a top surface of the support substrate and corresponding to the folding area,
each of the plurality of pores is randomly distributed in the support substrate to form a porous structure,
wherein the support substrate includes an upper region and a lower region, and
wherein the plurality of pores is disposed only in the lower region.

18. A foldable display device, comprising:
a display panel including a folding area and a non-folding area disposed on both sides of the folding area;
a back plate disposed under the display panel; and
a support substrate disposed under the back plate and made of a porous metal or a porous alloy including a plurality of pores,
wherein the support substrate includes a plurality of groove patterns recessed from a bottom surface toward a top surface of the support substrate and corresponding to the folding area, and
each of the plurality of pores is randomly distributed in the support substrate to form a porous structure,
a length of the minor axis of each of the plurality of groove patterns is 1.5 to 3 times greater than the size of each of the plurality of pores.

* * * * *